United States Patent [19]

Watanabe et al.

[11] Patent Number: 4,843,451
[45] Date of Patent: Jun. 27, 1989

[54] PHOTOVOLTAIC DEVICE WITH O AND N DOPING

[75] Inventors: Kaneo Watanabe; Tsugufumi Matsuoka; Yukio Nakashima, all of Hirakata; Hisao Haku, Neyagawa, all of Japan

[73] Assignee: Sanyo Electric Co., Ltd., Moriguchi, Japan

[21] Appl. No.: 228,796

[22] Filed: Jul. 29, 1988

Related U.S. Application Data

[63] Continuation of Ser. No. 842,636, Mar. 21, 1986, abandoned.

[30] Foreign Application Priority Data

Mar. 28, 1985 [JP] Japan .................................. 60-64185

[51] Int. Cl.⁴ .......................................... H01L 29/167
[52] U.S. Cl. ........................................ 357/63; 357/2; 357/58; 357/59; 357/30; 357/90
[58] Field of Search ................. 357/63, 2, 58, 59 B, 357/59 C, 59 D, 30 K, 30 J, 30 P, 90

[56] References Cited

U.S. PATENT DOCUMENTS

| | | | |
|---|---|---|---|
| 4,064,521 | 12/1977 | Carlson | 357/2 |
| 4,385,199 | 5/1983 | Hamakawa et al. | 357/2 X |
| 4,460,670 | 7/1984 | Ogawa et al. | 357/2 X |
| 4,581,476 | 4/1986 | Yamazaki | 357/90 X |
| 4,626,885 | 12/1986 | Ishioka et al. | 357/90 X |
| 4,781,765 | 11/1988 | Watanabe et al. | 357/30 X |

OTHER PUBLICATIONS

Tsuda et al, "The Light Induced Degradation of A-Si Films and Solar Cells", *Technical Digest of the International PVSEC-1*, Kobe, Japan, 1984, 213–216.

*Primary Examiner*—Rolf Hille
*Assistant Examiner*—William A. Mintel
*Attorney, Agent, or Firm*—W. G. Fasse; D. H. Kane, Jr.

[57] ABSTRACT

A photovoltaic device has at least one set of amorphous semiconductor layers forming a p-i-n junction structure, wherein at least one of the semiconductor layers having a given thickness, is doped with nitrogen and oxygen to a depth forming at least part of said given thickness. Such a photovoltaic device is fabricated by depositing on a substrate at least one set of amorphous semiconductor layers which form a p-i-n junction structure, and by doping at least one of the layers with nitrogen and oxygen to a depth forming at least part of the thickness of the doped layer.

8 Claims, 5 Drawing Sheets

PHOTOVOLTAIC DEVICE WITH O AND N DOPING

This application is a continuation of application Ser. No. 842,636, now abandoned, filed Mar. 21, 86.

BACKGROUND OF THE INVENTION

1. Field of the Invention

The present invention relates to a photovoltaic device for converting optical energy into electric energy and more particularly to an improvement in the resistance of the device to a degradation of the conversion efficiency.

2. Description of the Prior Art

A typical conventional photovoltaic cell such as described in U.S. Pat. No. 4,064,521 comprises a front transparent electrode layer, amorphous silicon (a-Si) layers forming a p-i-n junction structure, and a back electrode layer stacked in that order on a glass plate. The a-Si layers are generally deposited by a plasma CVD (chemical vapor deposition) method, utilizing a gas of a silicon compound.

A photovoltaic cell disclosed in U.S. Pat. No. 4,385,199 is improved in its conversion efficiency by providing a p-layer of amorphous silicon carbide (a-$Si_xC_{1-x}$) instead of the p-layer of a-Si. Since the p-layer of a-$Si_xC_{1-x}$ is optically less absorptive than the p-layer of a-Si, more light irradiation reaches the i-layer of a-Si, which substantially contributes to the photoelectric conversion, which thus becomes more effective due to the so-called window effect whereby the output current is increased.

However a, photovoltaic cell comprising amorphous semiconductor layers of silicon derivatives is degraded in its conversion efficiency after exposure to intensive light for a long time period. The present inventors have reported in *Technical Digest of the International PVSEC-1*, Kobe, Japan, 1984, pp. 213–216 that such degradation depends strongly on the concentration of an oxygen impurity introduced into the amorphous semiconductor layers, i.e., the degradation ratio decreases with a decrease of the oxygen concentration. With a usual CVD apparatus, however, a small amount of leakage of oxygen from the atmosphere is inevitable, so that it is difficult to completely avoid an oxygen impurity. In order to effectively decrease the oxygen impurity, an expensive and complicated CVD apparatus provided with an ultra high vacuum chamber will be required.

SUMMARY OF THE INVENTION

It is a major object of the present invention to prevent the degradation of the conversion efficiency in the photovoltaic device.

A photovoltaic device in accordance with the present invention comprises at least one set of amorphous semiconductor layers forming a p-i-n junction structure, wherein at least one layer of the semiconductor layers is intentionally doped with nitrogen and oxygen to a depth forming at least part of its thickness.

A method for fabricating a photovoltaic device in accordance with the present invention comprises steps for depositing at least one set of amorphous semiconductor layers which form a p-i-n junction structure, and doping at least one of the layers with nitrogen and oxygen to a depth forming at least part of the thickness of the layer that is being doped.

Special attention has been paid in the prior art only to decreasing the impurities of oxygen and nitrogen in the semiconductor layers of the photovoltaic cell. In the present invention, however, the degradation of the conversion efficiency is prevented by intentionally doping at least one of the layers of the device with oxygen and nitrogen by rising a conventional inexpensive CVD apparatus, up to respective concentrations higher than the usual respective impurity concentrations.

These object and other objects, features, aspects and advantages of the present invention will become more apparent from the following detailed description of the present invention when taken in conjunction with the accompanying drawings.

BRIEF DESCRIPTION OF THE DRAWINGS

It is noted that the same reference characters are used in FIGS. 1A, 2A, 3A and 4A for corresponding portions.

DESCRIPTION OF PREFERRED EMBODIMENTS AND OF THE BEST MODE OF THE INVENTION

Figure 1A:
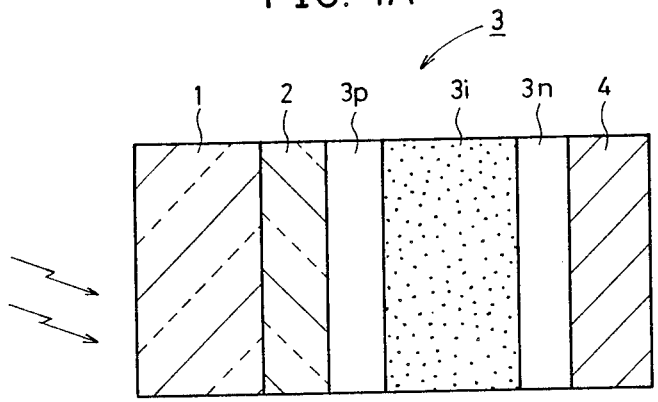
FIG. 1A is a sectional view of a cell for a photovoltaic device in accordance with the present invention, wherein the i-layer is doped with nitrogen and oxygen.

Referring to FIG. 1A, there is schematically shown a sectional view of a cell for a photovoltaic device according to an embodiment of the present invention. A front electrode 2 is formed on a transparent insulator substrate 1 such as a glass plate. The front electrode 2 is made of a transparent conductive oxide such as $In_2O_3$, ITO or $SnO_2$. A p-layer 3p, a practically intrinsic i-layer 3i, and an n-layer 3n of amorphous semiconductor material are deposited in the above order on the front electrode 2. A back electrode 4 of a material such as aluminum is formed on the n-layer 3n.

The amorphous semiconductor layers 3 are exposed to light through the transparent substrate 1 and electrode 2. The i-layer 3i when excited by photons, generates pairs of a free electron and a positive hole as electric change carriers. The generated electrons and holes move in an electric field due to the p-i-n junction toward the back electrode 4 and the front electrode 2, respectively, whereby an output current can be obtained between the front and back electrode.

The p-layer 3p may be of amorphous silicon carbide deposited by a CVD method utilizing a gas mixture containing monosilane ($SiH_4$), methane ($CH_4$) and a small amount of diborane ($B_2H_6$). The n-layer 3n may be of amorphous silicon deposited from a gas mixture containing $SiH_4$ and a small amount of phosphine ($PH_3$) with a CVD method.

An important feature of this embodiment resides in the deposition process and composition of the i-layer 3i which substantially contributes to the photoelectric conversion. In order to dope nitrogen (N) and oxygen (O) up to concentrations higher than the usual impurity concentrations of about 0.006 at.% N and about 0.02-0.04 at.% O respectively, the i-layer may be deposited by a plasma CVD method, a photo CVD method or the like utilizing a gas mixture containing $SiH_4$ and elements N and O. In the photo CVD method, a laser, a mercury lamp or the like can be used as a light source. A higher silane ($Si_n H_{2n+2}$: n=2, 3, . . . ) may be used instead of the monosilane. Gases such as $N_2$, $NH_3$ and $NO_x$ can be used as a constituent gas containing the element N, and gases such as $O_2$ and $NO_x$ can be used as a gas containing the element O.

The present inventors have prepared sample cells of the type shown in FIG. 1A which have various concentrations of doped N and O, and they investigated the degradation characteristics of the conversion efficiency in the sample cells.

The amorphous semiconductor layers 3 of those sample cells have been deposited by a radio frequency plasma CVD method. The p-layer of a-$Si_xC_{1-x}$ was deposited to about 200 Å in thickness under a condition of a gaseous composition of $CH_4/(SiH_4+CH_4)=30\%$ and $B_2H_6/SiH_4=0.3\%$. The i-layer of a-Si was deposited to about 5000 Å in thickness under a condition of $N_2/(SiH_4+N_2)=5\%$ and $O_2/(SiH_4+O_2)=X\%$, where X is a variable. The n-layer of a-Si was deposited to about 500 Å in thickness under a condition of $PH_3/SiH_4=1\%$.

Under the above described condition of $N_2/(SiH_4+N_2)=5\%$, the i-layer is doped with nitrogen to a concentration of 0.02 at.%. Table I shows concentrations of oxygen doped into the i-layers of samples 1a-1e under conditions of various values of $O_2/(SiH_4+O_2)$.

TABLE I

| sample | $\dfrac{O_2}{SiH_4 + O_2}$ | oxygen content (at. %) |
|---|---|---|
| 1a | 0.13 | 0.05 |
| 1b | 0.2 | 0.08 |
| 1c | 1.0 | 0.4 |
| 1d | 12.5 | 5.0 |
| 1e | no addition | 0.04 |

Figure 1B:
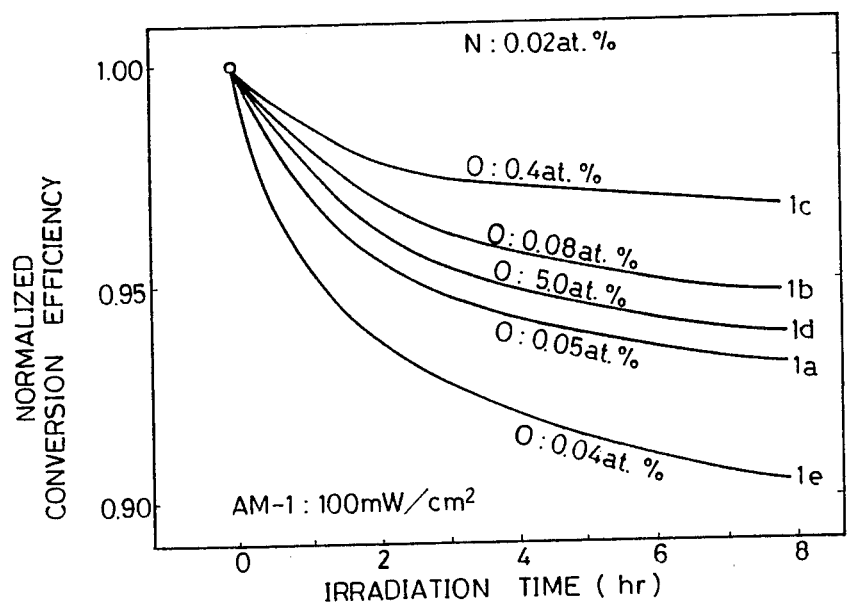
FIG. 1B shows degradation curves of the conversion efficiency in cells of the type shown in FIG. 1A, with respect to the doped nitrogen and oxygen concentrations.

FIG. 1B shows degradation curves of the conversion efficiency in the samples 1a–1e. These degradation curves were measured using a solar simulator providing an irradiation in the solar spectrum (AM-1) on the equator at an intensity of 100 mW/cm². The conversion efficiency in each sample cell is normalized by the initial efficiency in that sample. Since the sample 1e was prepared under a condition of no intentional addition of oxygen, the oxygen content in the i-layer of the sample 1e corresponds to the usual impurity concentration. As seen in FIG. 1B, the degradation rates of the samples 1a–1d which were intentionally doped with oxygen are decreased as compared with that of the sample 1e. Particularly, the sample 1c containing 0.4 at.% O and 0.02 at.%N in the i-layer shows the highest resistance to the degradation.

Figure 1C:
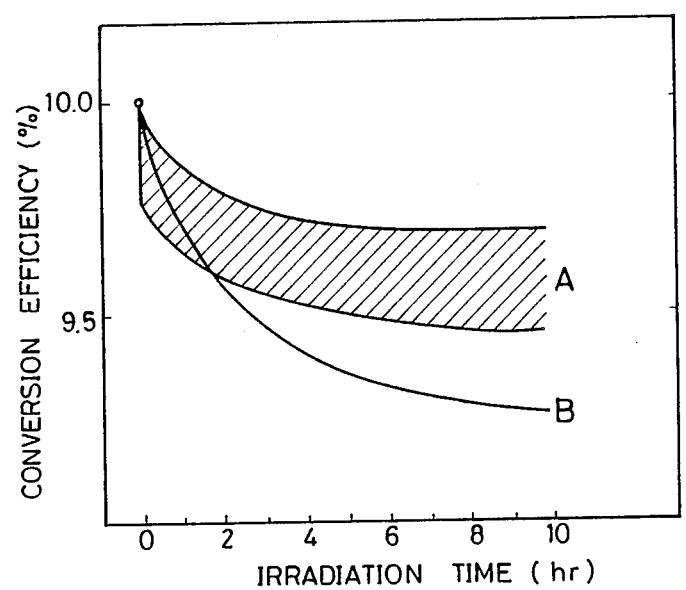
FIG. 1C shows a distribution range A of net curves of the conversion efficiency in the cells 1a–1d shown in FIG. 1B, comparing these cells of the invention with a an efficiency curve B of a conventional cell.

Referring to FIG. 1C, there is shown a distribution range A of net curves of the conversion efficiency in the samples 1a–1d, comparing with an efficiency curve B of a conventional cell not intensionally doped with either of N and O. The samples 1a–1d are not higher in the net efficiency than the conventional cell at the initial stage of the degradation. However the present cells have a higher efficiency at the latter stage, since the present samples are improved in resistance to the degradation.

In order to determine a preferable concentration range of nitrogen, various doping amounts of nitrogen were tried with the oxygen content being fixed at the most preferable concentration of 0.4 at.% O. As a result, it is found that nitrogen is effective in improving the resistance to the degradation in a range of about 0.01–3.0 at.% N doped under a condition of $N_2/(SiH_4+N_2)=20-50\%$.

Although only one unit cell is shown in FIG. 1A, it goes without saying that an integrated photovoltaic device may be formed connecting a plurality of such cells in series or in parallel. An integrated photovoltaic device which includes cells connected in series is described, for example, in U.S. Pat. No. 4,281,208.

Figure 2A:
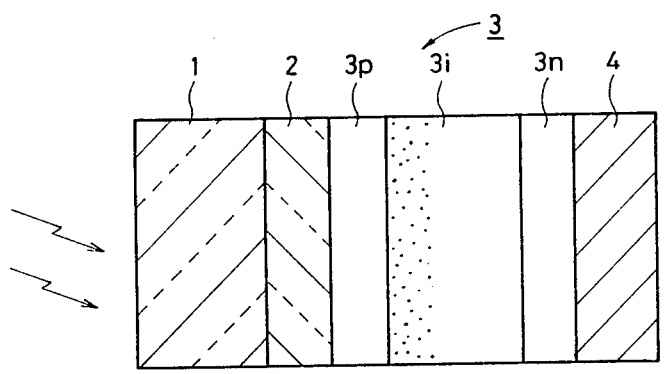
FIG. 2A illustrates a cell according to another embodiment of the present invention, wherein the i-layer is doped with nitrogen and oxygen to a depth forming at least part of the thickness of the i-layer.

Referring to FIG. 2A, there is shown a cell according to another embodiment of the present invention. This cell is fabricated similarly to that of FIG. 1A, except that only a partial layer of the i-layer 3i is doped with N and O. Table II shows concentrations of oxygen doped into the partial layer of samples 2a–2c. The partial layer of each sample also contains doped 0.02 at.% N.

TABLE II

| sample | $\dfrac{O_2}{SiH_4 + O_2}$ | oxygen content (at. %) |
|---|---|---|
| 2a | 1.00 | 0.40 |
| 2b | 0.13 | 0.05 |
| 2c | no addition | 0.04 |

Figure 2B:
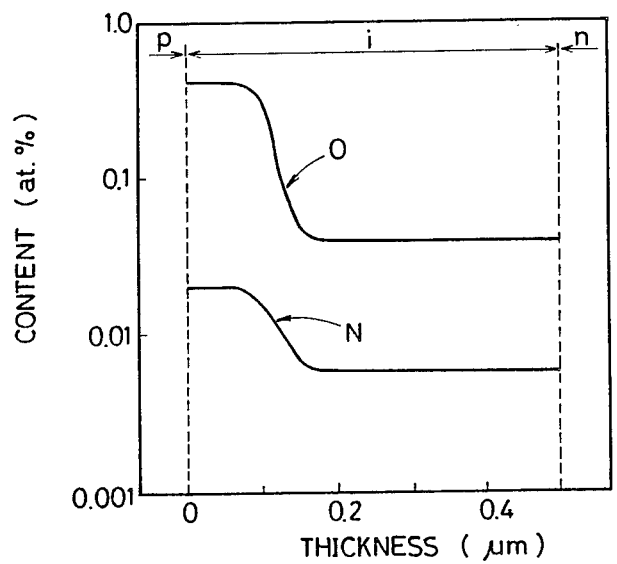
FIG. 2B shows concentration curves of the doped nitrogen and oxygen in the i-layer in a cell of the type shown in FIG. 2A.

Referring to FIG. 2B, there are shown concentration profiles of oxygen and nitrogen in the partially doped i-layer of the sample 2a. As seen in FIG. 2B, the depth of the doped portion of the layer was less than one third of the total given thickness of the whole i-layer.

Figure 2C:
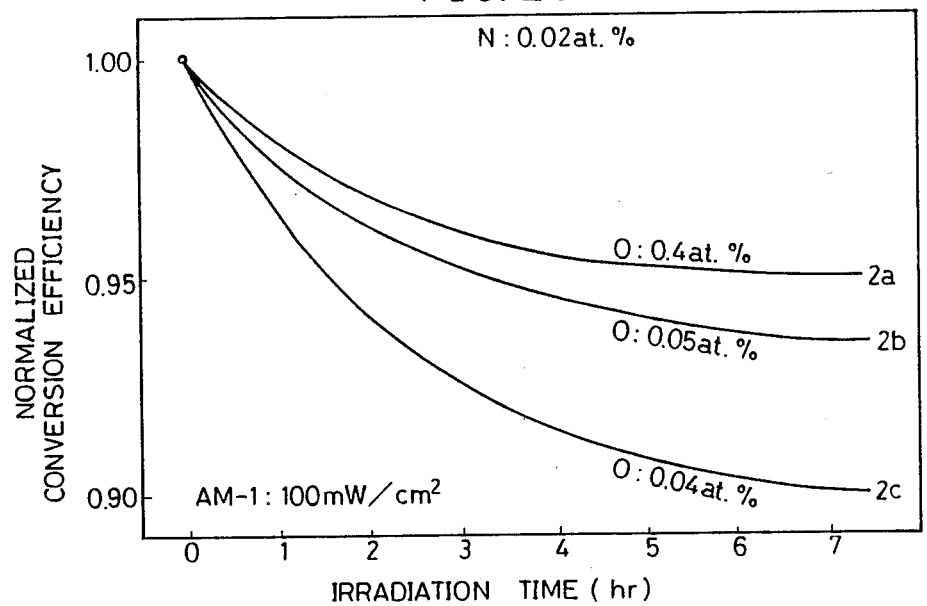
FIG. 2C shows degradation curves of the conversion efficiency in cells of the type shown in FIG. 2A.

Referring to the degradation curves of the samples 2a–2c in FIG. 2C, it is apparent that oxygen and nitrogen doped into only a portion of the total layer depth or thickness of the i-layer, are also effective in improving the resistance to the degradation of the conversion efficiency.

Figure 3A:
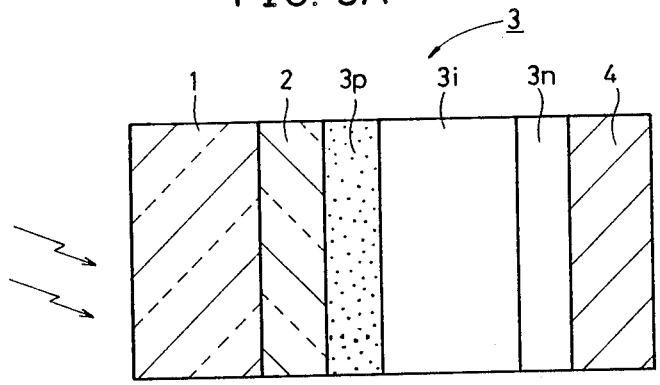
FIG. 3A illustrates a cell according to a further embodiment of the present invention, wherein the p-layer is doped with nitrogen and oxygen.

Referring to FIG. 3A, there is shown a cell according to a further embodiment of the present invention. This type of cell is similar to that of FIG. 1A, except that the p-layer 3p instead of the i-layer 3i, is doped with N and O. Table III shows concentrations of oxygen doped into the p-layers of samples 3a–3d. The p-layer of each sample also contains doped 0.02 at.% N.

TABLE III

| sample | $\frac{O_2}{SiH_4 + O_2}$ | oxygen content (at. %) |
| --- | --- | --- |
| 3a | 0.13 | 0.05 |
| 3b | 1.00 | 0.4 |
| 3c | 12.5 | 5.0 |
| 3d | no addition | 0.04 |

Figure 3B:
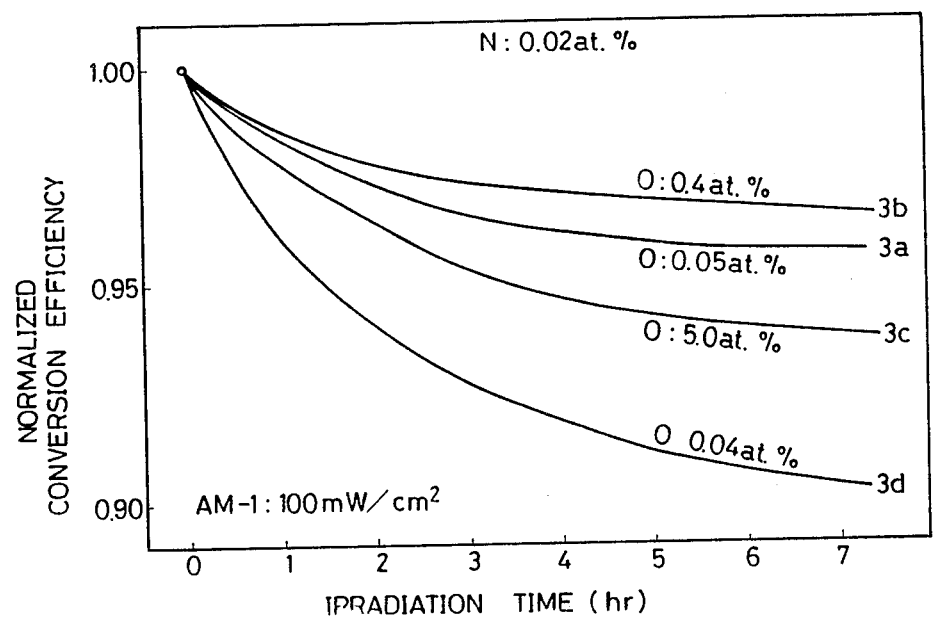
FIG. 3B shows degradation curves of the conversion efficiency in cells of the type shown in FIG. 3A.

Referring to the degradation curves of the samples 3a–3d in FIG. 3B, it is apparent that oxygen and nitrogen doped into only the p-layer are also effective in improving the resistance to the degradation of the conversion efficiency.

Figure 4A:
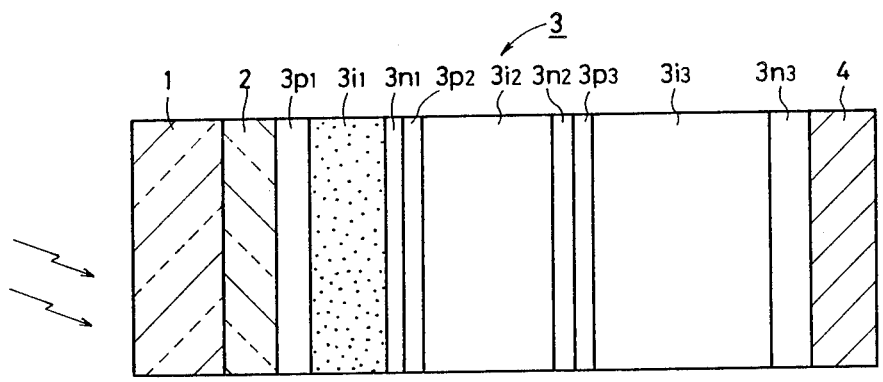
FIG. 4A illustrates a tandem-type cell according to a still further embodiment of the present invention, wherein the first i-layer is doped with nitrogen and oxygen.
Figure 4B:
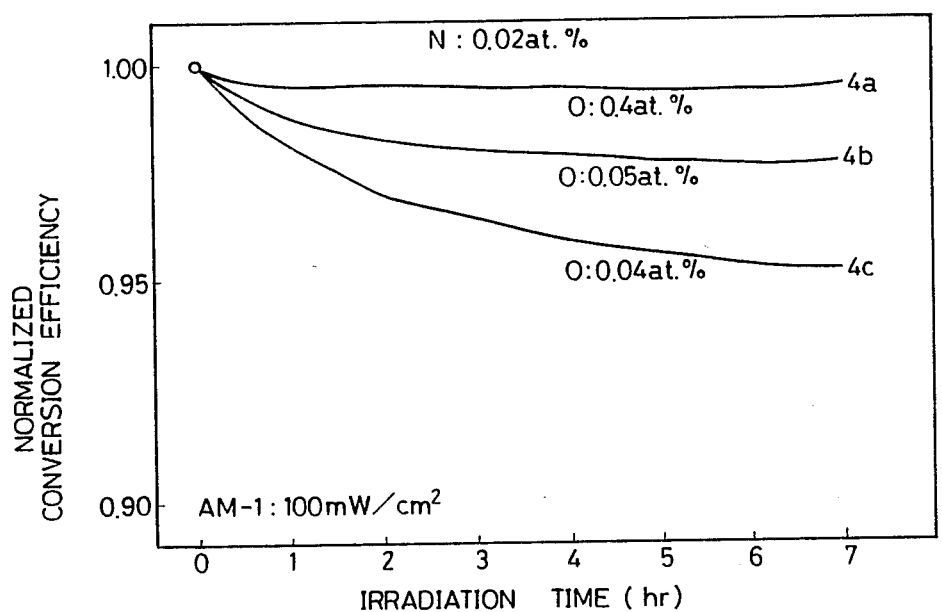
FIG. 4B shows degradation curves of the conversion efficiency in the tandem-type cells as shown in FIG. 4A.

Referring to FIG. 4A, there is shown a tandem-type cell according to a still further embodiment of the present invention. In that cell, the first i-layer $3i_1$ is doped with N and O. The first p-layer $3p_1$ of a-$Si_x C_{1-x}$ was deposited to about 200 Å in thickness under a condition of $CH_4/(SiH_4+CH_4)=30\%$ and $B_2H_6/SiH_4=0.3\%$. The second and third p-layers $3p_2$, $3p_3$ of a-Si each were deposited to about 50 Å in thickness under a condition of $B_2H_6/SiH_4=1\%$. The first, second and third i-layers $3i_1$, $3i_2$, $3i_3$ of a-Si were deposited to about 500, 1500 and 5000 Å in thickness, respectively. The first, second and third n-layers $3n_1$, $3n_2$, $3n_3$ of a-Si were deposited under a condition of $PH_3/SiH_4=1\%$ to about 50, 50 and 500 Å, respectively.

Only the first i-layer $3i_1$ was doped with N and O under a condition of $N_2/(SiH_4+N_2)=5\%$ and $O_2/(SiH_4+O_2)=X\%$, where X is a variable. Table IV shows concentrations of oxygen doped into the first i-layers of samples 4a–4c.

TABLE IV

| sample | $\frac{O_2}{SiH_4 + O_2}$ | oxygen content (at. %) |
| --- | --- | --- |
| 4a | 1.00 | 0.40 |
| 4b | 0.13 | 0.05 |
| 4c | no addition | 0.04 |

Referring to degradation curves of the sample 4a–4c, it is apparent that oxygen and nitrogen doped into only the first i-layer of the tandem-type cell, are also effective in improving the resistance to the degradation of the conversion efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising at least one set of amorphous semiconductor layers which form a p-i-n junction structure, said semiconductor layers including a p-layer, an intrinsic i-layer, and an n-layer, at least one layer of said semiconductor layers having a given thickness and being doped simultaneously with nitrogen and oxygen so that both nitrogen and oxygen are present together in said at least one layer to a depth forming at least part of said given thickness, and so that said doped layer contains nitrogen with the range of 0.01 to 3.0 at.% and oxygen within the range of 0.05 to 5.0 at.%.

2. The photovoltaic device of claim 1, wherein the preferred oxygen range is 0.1 to 1.0 at.%.

3. The photovoltaic device of claim 1, wherein a doped layer contains nitrogen of about 0.02 at.% and oxygen of about 0.4 at.%.

4. The photovoltaic device of claim 1, wherein said intrinsic i-layer is doped.

5. The photovoltaic device of claim 1, wherein said intrinsic i-layer is doped to at least part of its depth.

6. The photovoltaic device of claim 1, wherein at least one of the doped nitrogen and oxygen is distributed with a concentration which changes in the direction of the depth of the i-layer from one surface of the i-layer to an opposite surface of the i-layer.

7. The photovoltaic device of claim 1, wherein a p-layer is doped.

8. The photovoltaic device of claim 1, wherein an n-layer is doped.

* * * * *

UNITED STATES PATENT AND TRADEMARK OFFICE
CERTIFICATE OF CORRECTION

PATENT NO. : 4,843,451
DATED : June 27, 1989
INVENTOR(S) : Kaneo Watanabe et al.

It is certified that error appears in the above-identified patent and that said Letters Patent is hereby corrected as shown below:

Claim 1, column 6, line 22, replace "with" by --within--.

Signed and Sealed this

Third Day of July, 1990

Attest:

HARRY F. MANBECK, JR.

*Attesting Officer*     Commissioner of Patents and Trademarks